United States Patent

Horvath et al.

[11] Patent Number: 5,014,117
[45] Date of Patent: May 7, 1991

[54] HIGH CONDUCTION FLEXIBLE FIN COOLING MODULE

[75] Inventors: Joseph L. Horvath, Poughkeepsie; Robert G. Biskeborn, Pawling; Carl Yakubowski, Hyde Park, all of N.Y.

[73] Assignee: International Business Machines Corporation, Armonk, N.Y.

[21] Appl. No.: 503,503

[22] Filed: Mar. 30, 1990

[51] Int. Cl.$^5$ .............................. F28F 5/00; F28F 7/00
[52] U.S. Cl. ........................................ 357/81; 361/381; 361/386; 165/185
[58] Field of Search .................... 357/81, 82, 74; 361/381, 386; 165/185

[56] References Cited

U.S. PATENT DOCUMENTS

| | | | |
|---|---|---|---|
| 3,495,133 | 2/1970 | Miller | 317/101 |
| 3,930,114 | 12/1975 | Hodge | 357/72 |
| 3,993,123 | 11/1976 | Chu | 165/80 |
| 4,190,098 | 2/1980 | Hanlon | 165/1 |
| 4,263,965 | 4/1981 | Mansuria | 165/80 |
| 4,311,193 | 1/1983 | Verhaeghe | 165/149 |
| 4,498,530 | 2/1985 | Lipschutz | 165/185 |
| 4,707,726 | 11/1987 | Tinder | 357/81 |
| 4,730,666 | 3/1988 | Flint et al. | 165/80.4 |
| 4,748,495 | 5/1988 | Kucharek | 357/82 |
| 4,770,242 | 9/1988 | Daikoku et al. | 357/81 |
| 4,800,956 | 1/1989 | Hamburgen | 357/81 |
| 4,908,695 | 3/1990 | Morihara et al. | 357/81 |

FOREIGN PATENT DOCUMENTS 56-53395 5/1981 Japan .

Primary Examiner—Andrew J. James
Assistant Examiner—Viet Q. Nguyen
Attorney, Agent, or Firm—Ira David Blecker

[57] ABSTRACT

An apparatus for removing heat from a heat generating device. The apparatus includes at least one heat conductive finned thermal device insert including a base having at least one first fin, and preferably haing a plurality of first fins, on a first surface and a second surface which is flat and a heat conductive second thermal device, preferably a cooling hat, having a plurality of second fins. The first fins are interspersed with the second fins. At least one of the first and second fins is of a thermally conductive, flexible material so that a gap otherwise existing between the interspersed fins is substantially eliminated. Finally, at least a portion of the first and second fins are biased against one another.

35 Claims, 7 Drawing Sheets

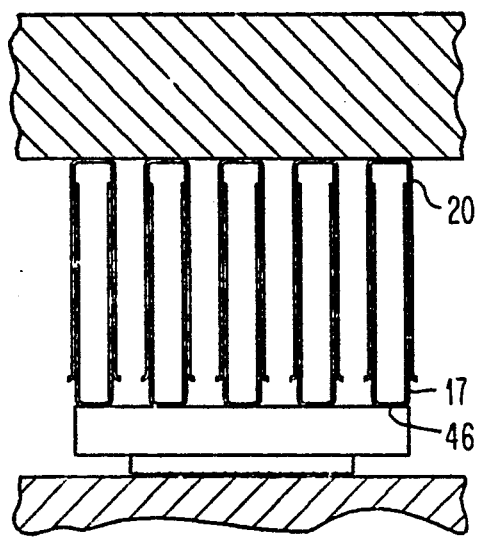
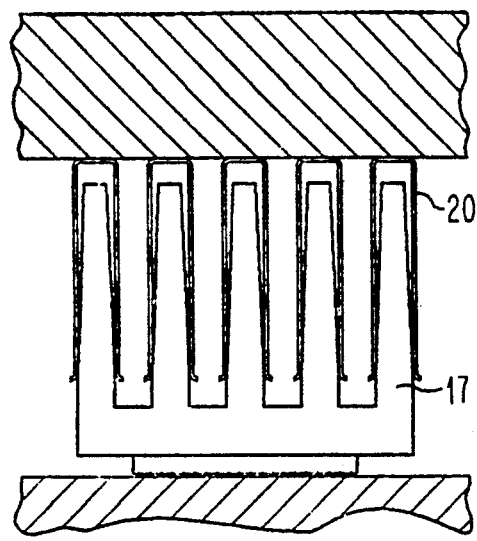
FIG. 7          FIG. 8
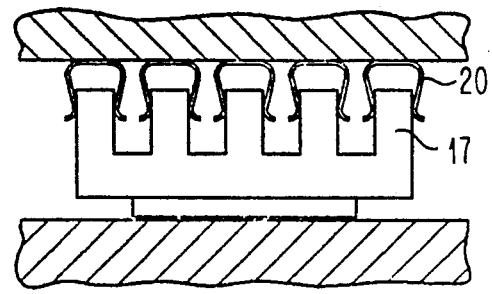
FIG. 9
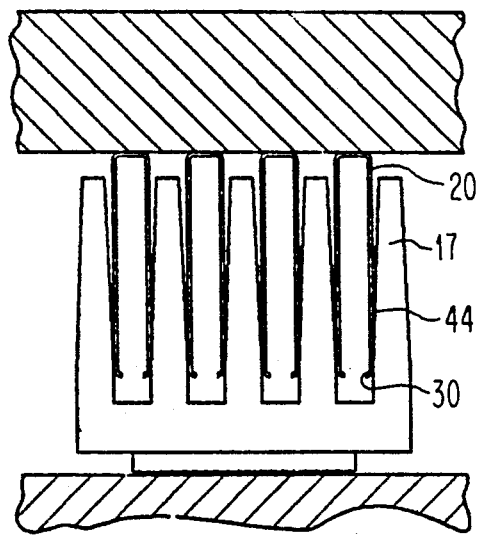
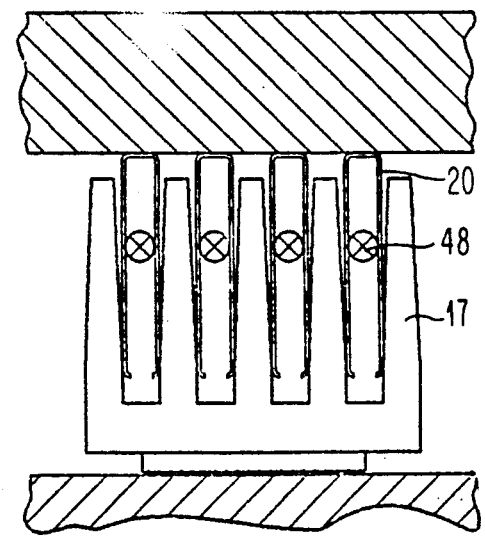
FIG. 10         FIG. 11

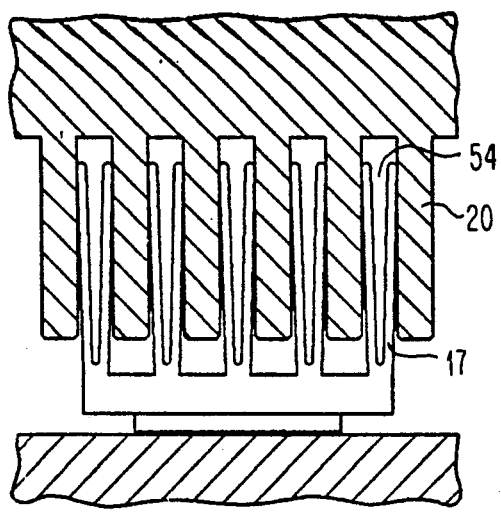
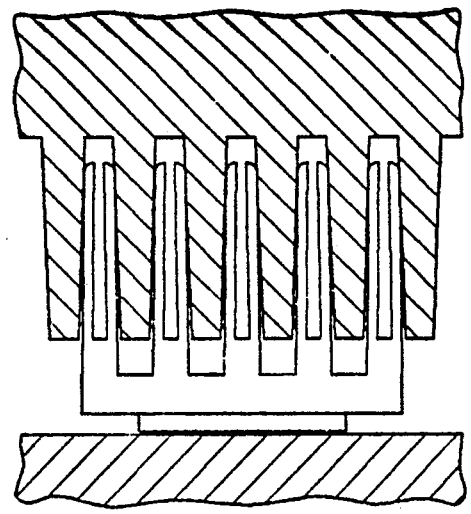
FIG. 17      FIG. 18
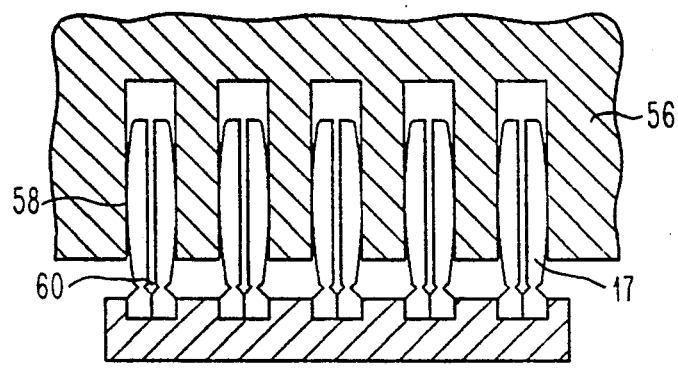
FIG. 19
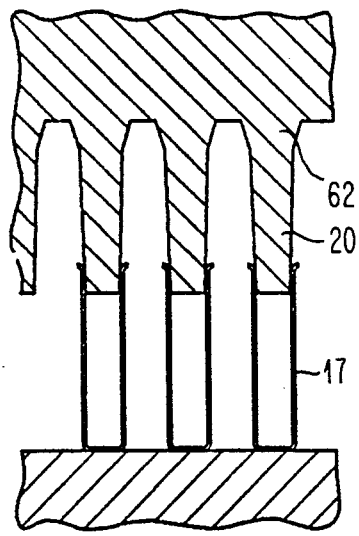
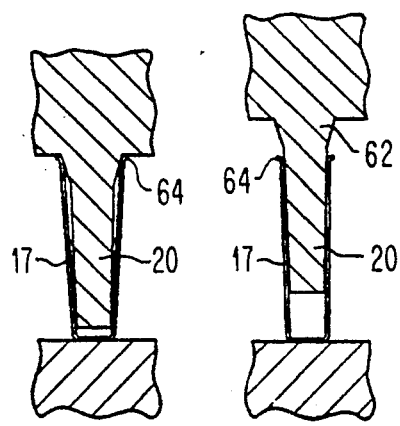
FIG. 20A      FIG. 20B   FIG. 20C

HIGH CONDUCTION FLEXIBLE FIN COOLING MODULE

BACKGROUND OF THE INVENTION

This invention relates to conduction cooling of small, flat, heat generating devices such as integrated circuit (IC) chips, and more particularly, to an improved cooling device having a very low thermal resistance path between the heat generating devices and heat sink.

The introduction of large scale integration (LSI) and very large scale integration (VLSI) at the chip level and very large scale integration at the module level by packaging multiple chips on a single multilayer substrate has significantly increased both circuit and power densities. As a consequence, there arises the need to remove heat flux densities on the order of 1000kw/square meter at the chip level. To remove these high heat flux densities, there have been proposed various means of dissipating the heat. One limitation is that the cooling fluid (e.g., water) cannot come into direct contact with the chips or the area wherein the chips are mounted. Thus, a cooling hat must be incorporated between the chips and fluid which may be contained in a detachable or integral cold plate.

As VLSI chips increase in circuit density, switching speed and corresponding power, the thermal resistance of heat conduction systems, wherein an internal thermal device insert is placed between the chips and cooling hat, must be further reduced. In the thermal conduction module of Chu et al. U.S. Pat. No. 3,993,123, the internal thermal device insert is a piston which contacts the chip at one point. The thermal conduction module is very useful and successful in VLSI systems of the present but is not easily extendable to future high powered systems in all applications.

In the present state of the art there are many structures for achieving enhanced heat transfer. Among these are intermeshed fin structures wherein the internal thermal device insert has substantially rigid fins which mate with corresponding fins in the cooling hat. One such fin structure is that disclosed in Horvath et al. U.S. patent application Ser. No. 198,962, filed May 26, 1988, the disclosure of which is incorporated by reference herein. These structures have the potential to provide improved thermal performance over single-surface structures, such as the piston in the thermal conduction module, because they comprise means for increasing the heat transfer area between the internal thermal device insert, which contacts the chip, and the cooling hat. Consequently, the thermal resistance between the chip and the cooling hat is lowered.

An inherent feature of these substantially rigid fin structures is that there will always be a gap, sometimes relatively large, between the intermeshed fins to accommodate chip tilt. This gap may be compensated by side-biasing or by filling the gap with a compliant, thermally conductive medium such as disclosed in Horvath et al. While such a fin structure does provide a low thermal resistance, the thermal resistance of the structure may be decreased by decreasing or, more preferably, substantially eliminating this gap.

An alternative structure has been proposed in Mansuria et al. U.S. Pat. No. 4,263,965 wherein a plurality of thermally conductive thin leaf shaped members are positioned within mating recesses of a cooling hat. Each of the thin leaf shaped members is independently spring-loaded against the chip. Chip tilt is accommodated at the chip-to-leaf interface. Thus, this design often times results in line-contact of the thin leaf shaped members against the chip, leading to a decrease in thermal efficiency of the module. Further, and perhaps most importantly, the leaf shaped members, while being thin, are nevertheless rigid as are the mating recesses of the cooling hat. Due to manufacturing tolerances, there will always be a considerable gap between the leaf shaped members and the cooling hat, thereby contributing to increased thermal resistance.

It has been proposed in certain structures to make the fins out of a flexible material Thus, in Lipschutz U.S. Pat. No. 4,498,530, a plurality of flexible leaf elements are sandwiched between rigid spacer elements. The end result is a relatively rigid package, which is placed between the chip and the cold plate. Due to the fact that the flexible elements do not make good thermal contact with their corresponding flexible elements, the thermal resistance of this arrangement is unacceptably high. Also, since the entire structure is separate and distinct from the cold plate, an additional thermal resistance (i.e., arising from the interface between the cold plate and the structure) is included.

Tinder U.S. Pat. No. 4,707,726 discloses a heat sink having a channel therein and a plurality of semiconductor devices which are positioned within the channel. The semiconductor devices are side-biased against the side of the channel by a flexible member.

Berg U.S. Pat. No. 4,447,842 discloses a thermal device in contact with a chip. The thermal device has flexible fins which fit into channels of a cooling module. The cooling module is fitted with an expansible conduit which, upon expansion, causes the flexible fins to be forced against the sides of the cooling module, thereby aiding in the cooling of the chip.

Hanlon U.S. Pat. No. 4,190,098 discloses a cooling device for cooling a plurality of semiconductor devices. The cooling device comprises flexible fins which fit into the channels formed by the semiconductor devices.

Notwithstanding the previously described state of the art, there remains a need to increase the power dissipation capability of the cooling arrangement so as to be able to accommodate higher power chips.

It is thus a primary object of the present invention to have an improved cooling arrangement with increased power dissipation capability and decreased thermal resistance.

This and other objects of the invention will become more apparent after referring to the following description considered in conjunction with the accompanying drawings.

BRIEF SUMMARY OF THE INVENTION

The object of the invention has been achieved by providing, according to the invention, an apparatus for removing heat from a heat generating device comprising:
 at least one heat conductive thermal device insert comprising a base having at least one first fin on a first surface and a second surface which is flat;
 a second heat conductive thermal device having a plurality of second fins;
 said at least one first fin being interspersed with said second fins;
 wherein at least one of said first and second fins is of a thermally conductive, flexible material so that a gap otherwise existing between said interspersed fins is substantially eliminated and wherein at least a portion of said first and second fins are biased against one another.

Preferably, there are a plurality of said first fins.

BRIEF DESCRIPTION OF THE DRAWINGS

FIGS. 7–20C are partial cross-sectional views similar to FIG. 6 that show alternative embodiments of the high conduction flexible fin cooling module.

DETAILED DESCRIPTION OF THE INVENTION

Figure 1:
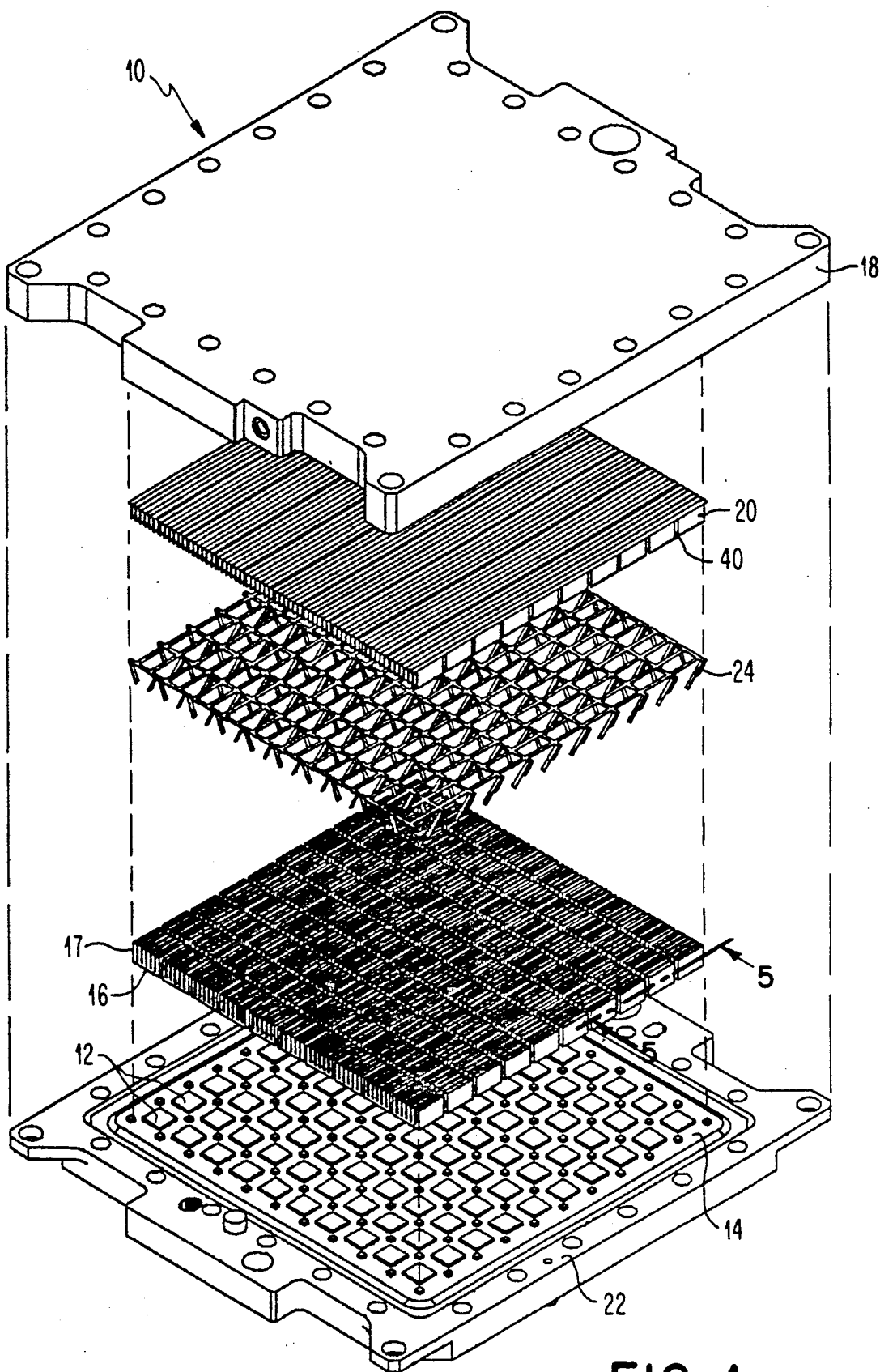
FIG. 1 is an exploded, perspective view of the high conduction flexible fin cooling module according to the invention.

Referring to the Figures in more detail, and particularly referring to FIG. 1, there is shown an exploded view illustrating the overall mechanical assembly of the specific elements of an apparatus, more specifically, a high conduction flexible fin cooling module, generally indicated by 10, built in accordance with the present invention for removing heat from heat generating devices such as semiconductor chips. In FIG. 1, a chip 12 that must be maintained below a specific temperature is mounted on a substrate 14. Preferably, the chips are mounted to substrate 14 by solder balls (also known as controlled collapse chip connections or C-4s as disclosed in U.S. Pat. No. 3,495,133, the disclosure of which is incorporated by reference herein) in a face down orientation. Substrate 14 sits in frame 22.

The substrate 14 is preferably a multilayer ceramic (MLC) substrate. The substrate may comprise ceramic and/or glass materials. Some of the more common materials for the substrate are alumina, cordierite glass-ceramic, mullite and borosilicate glasses. It should be understood that the present invention is not dependent on the substrate material per se and so would be expected to work well with a variety of substrates.

A finned internal thermal device insert 16 having at least one first fin 17 on a rigid base is positioned over each chip 12 and is able to move laterally in a plane parallel to the chip. Preferably, there will be a plurality of first fins 17. Since there are normally a plurality of chips in today's high performance modules, there will be a plurality of internal thermal device inserts so that each chip is matched with an insert. Second thermal device 18 has a plurality of second fins 20 which intermesh with the first fins 17 of the internal thermal device insert 16. Second thermal device 18 is preferably a cooling hat and will be referred to as such hereafter. Upon assembly of the module 10, cooling hat 18 is connected to frame 22 by suitable fastening means. Cooling hat 18 may be connected to, or be an integral part of, a cold plate (not shown) which provides a cooling fluid for dissipating heat from the cooling hat. Alternatively, cooling hat 18 may be provided with air cooling fins in the event that liquid cooling of the cooling hat is not required.

Figure 2:
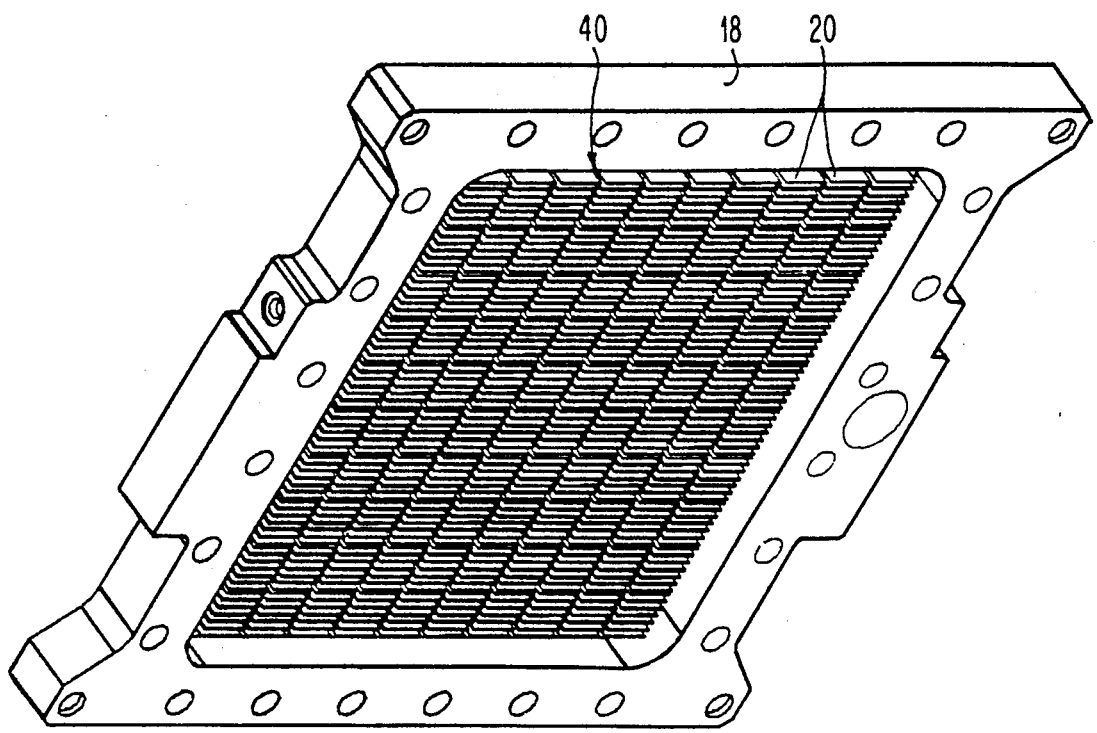
FIG. 2 is a perspective view of the bottom of the cooling hat with the flexible fins in place.

The underside of cooling hat 18 is shown more clearly in FIG. 2. As can be seen, second fins 20 have been positioned in the cooling hat and are now ready for mating with the finned thermal device inserts 16. Second fins 20 may be retained in the cooling hat 18 by, for example, soldering them in fixed relation to the hat.

An important feature of the present invention is that at least one of the first 17 and second 20 fins is a thermally conductive, flexible material so that a gap otherwise or normally existing between the interspersed sometimes also called intermeshed or interdigitated) fins is substantially eliminated. Further, at least a portion and usually all of the first and second fins are biased against one another. As will become more apparent hereafter, these important improvements lead to a marked decrease in the thermal resistance of the cooling apparatus over previous high conduction cooling modules.

While at least one of the first 17 and second 20 fins is a flexible material, it is contemplated by the present invention that both of the fins may be flexible in nature. If only one of the fins is flexible, then the other fin—whether it be first fin 17 or second fin 20—is substantially rigid.

The concept of being "flexible" is difficult to define with precision. The flexible fins should be resilient and, at the very least, be capable of being bent or flexed without undue difficulty when the first and second fins are mated together. The choice of material for the flexible fin is not restrictive but should include those materials having good thermal conductivity such as copper and beryllium copper. The flexible fins may also have been treated to have a spring temper to increase their elasticity.

Referring again to FIG. 1, the module 10 may further comprise a biasing means 24 located between the fins of the thermal device insert or the cooling hat. The biasing means 24 exerts a biasing force between the thermal device insert and the cooling hat. The general concept of this particular biasing means has been previously described in great detail in the Horvath et al. patent application, mentioned above. Suffice it to say here that the biasing means 24 exerts an adequate biasing force to urge the base of the thermal device insert toward the chip while not applying excessive forces that may destroy chip circuitry or cause excess fatigue or damage to the solder ball connections. The biasing means is advantageous in that it accommodates height variations among the different chips.

It is most preferred that the module 10 contain the biasing means 24. It is also preferred that the module contain a compliant thermally conductive medium to aid in the conduction of the heat from the chip to the cooling hat. The preferred thermally conductive medium is a synthetic oil such as poly(alphaolefin) oil.

Figure 4:
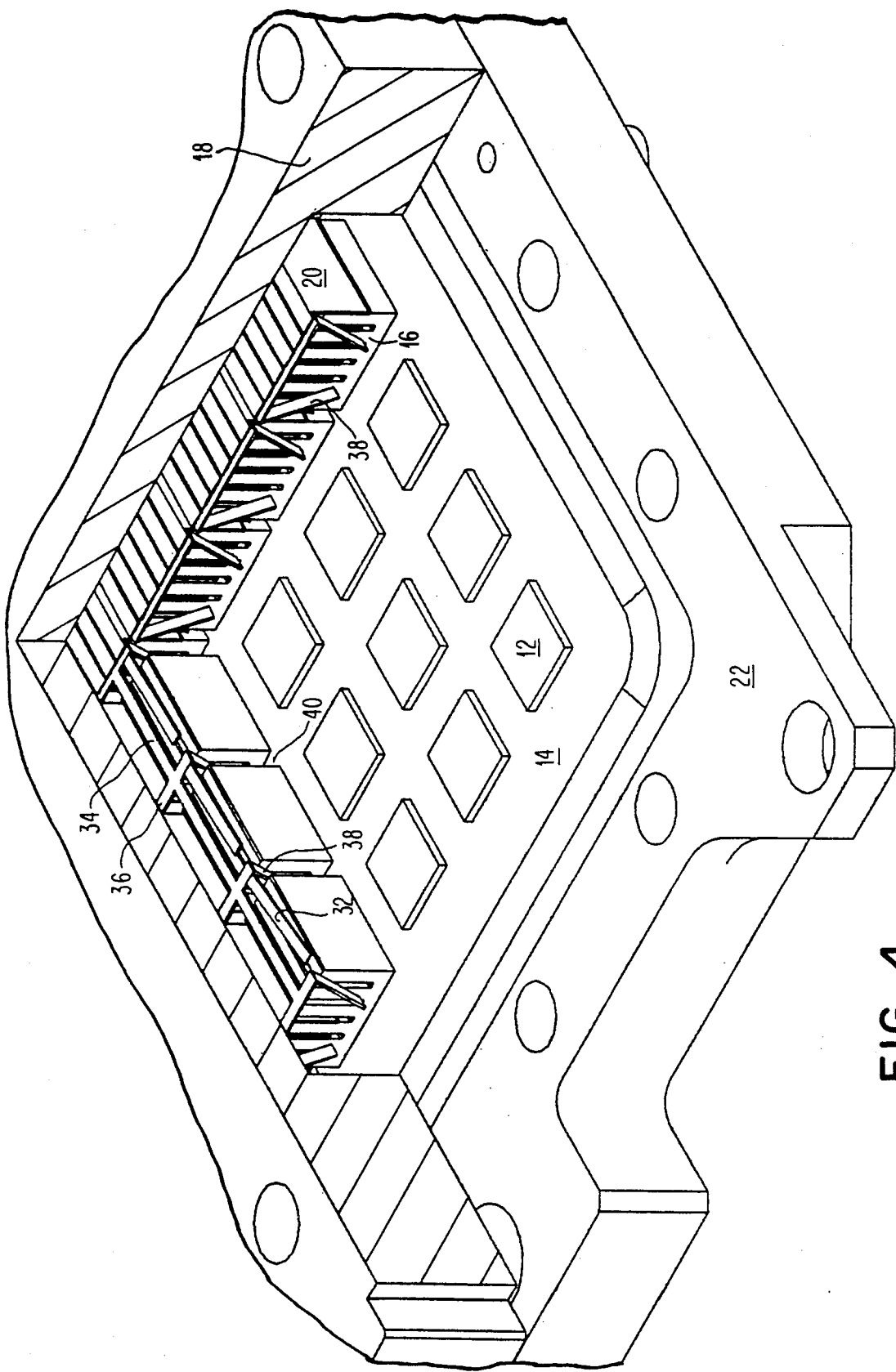
FIG. 4 is an enlarged, perspective view of the assembled high conduction flexible fin cooling module with one corner of the assembly cut away.
Figure 5:
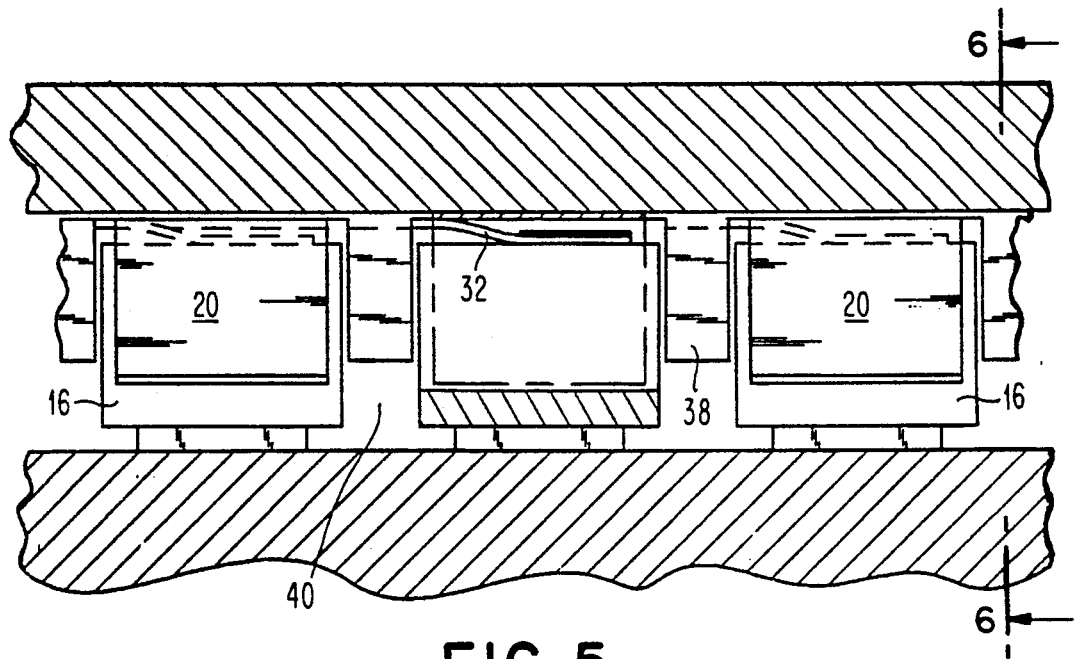
FIG. 5 is a partial cross-sectional view along the line 5—5 in FIG. 1 of a portion of the high conduction flexible fin cooling apparatus.
Figure 6:
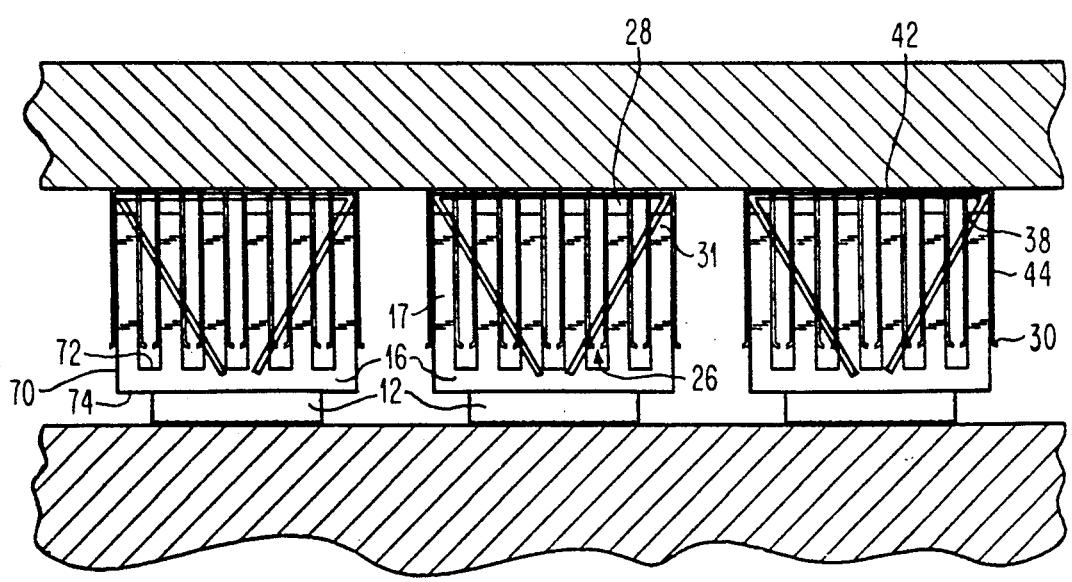
FIG. 6 is a partial cross-sectional view along the line 6—6 in FIG. 5 of a portion of the high conduction flexible fin cooling apparatus that shows a feature of the cantilever spring that retains each thermal device insert in position.

Referring now to FIGS. 4 to 6, the cooperation between all the components of the present invention can be seen more clearly. Thermal device insert 16 comprises a base 70 having a plurality of first fins 17 on a first surface 72 of the base 70. A second, opposite, surface 74 of the base is flat and is adapted for contacting a chip 12. The number of first fins may vary but it is preferable that there be five, and most preferably, six fins for a 6.5 mm square chip. Of course, the number of fins will vary with the size of the chip, the larger chips having the larger number of fins. As shown in these Figures, the first fins 17 are substantially rigid and the second fins 20 are the flexible fins. The biasing means 24 resides in the channels 26 formed between the ends 30 of the fins 20 and insert 16 or channels 28 formed between the ends 31 of the fins 17 and cooling hat 18. For purposes of the present invention, it is preferred that the biasing means 24 resides in channels 28 as shown in FIGS. 4 to 6.

When rigid first fins 17 of the insert are interspersed within flexible second fins 20, the flexible fins firmly contact the rigid fins so that any gap that might otherwise exist between the interspersed fins is substantially eliminated. This is for the ideal case when there is no chip tilt. On those occasions when there is chip tilt, the flexible and rigid fins will not be parallel to each other but, rather, will be at some angle. In this case, the nature of the flexible fins allows the flexible fins to bias against the rigid fins to thereby maintain contact between the flexible fins and the rigid fins. The flexible fins flex to accommodate fin misalignment and chip tilt. Thus, the location of the lines of contact between the flexible fins and rigid fins is not fixed. In either case, a gap that might otherwise exist between the interspersed fins is, for all intents and purposes, eliminated.

In the most preferred embodiment, when biasing means 24 is present, the biasing means will reside in channels 28. The biasing means 24 urges the thermal device insert toward the chip to apply a desired pressure against the chip, thereby assuring good thermal contact with the chip.

When the first and second fins are interspersed with each other, the flexible fins exert a force normal to the rigid fins. Simultaneously, the biasing means exerts a biasing force to urge the base of the thermal device insert toward the chip. It should be understood that the respective forces of the biasing means and flexible fins should be balanced such that the force exerted by the flexible fins is sufficient to firmly contact the rigid fins but not be so robust as to defeat the function of the biasing means.

Figure 3:
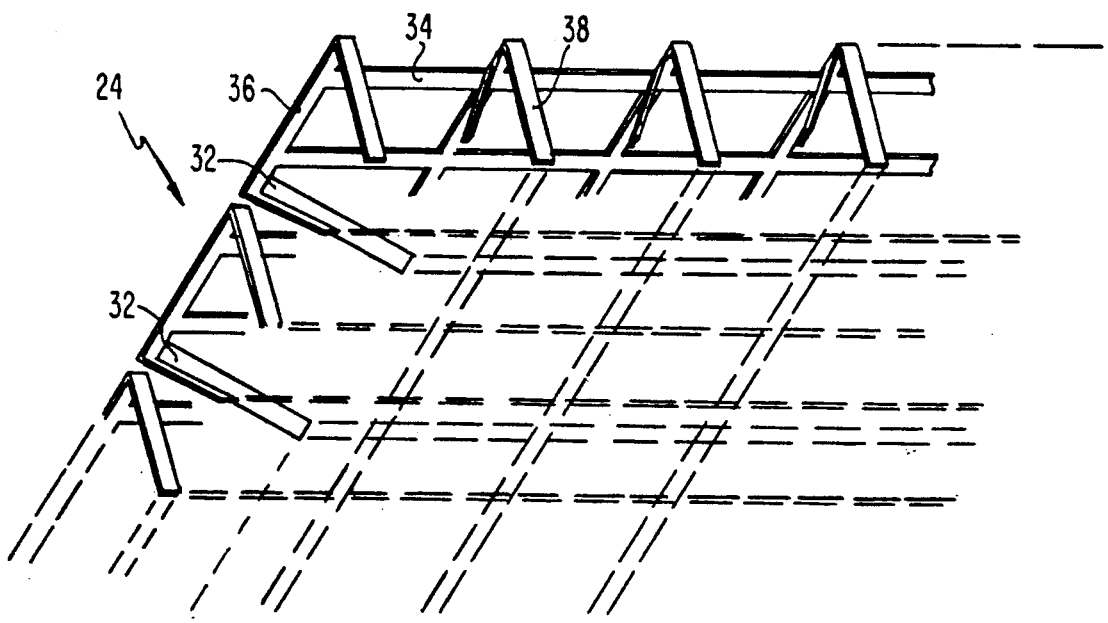
FIG. 3 is an enlarged, perspective view of the cantilever spring.

Referring to FIG. 3, the biasing means 24 is shown in greater detail. It is possible to make the biasing means separable so that each thermal device insert will have its own biasing means, separate and apart from every other biasing means. It has been found preferable, however, to make the biasing means so that a plurality of individual biasing means are connected together. For example, the biasing means 24 shown in FIGS. 1 and 3 represents all the individual biasing means connected together for the module 10.

The biasing means 24 has cantilever arms 32 which reside in channels 28. The cantilever arms 32 urge the thermal device inserts into contact with the chips. Individual biasing means are connected by longitudinal supports 34 which also reside within channels 28. If it were desirable to have more than one row of biasing means or more than one cantilever arm per chip site, then crosspiece 36 is necessary to connect longitudinal supports 34. Crosspieces 36 reside within channels 40 of the flexible second fins 20.

A further aspect of biasing means 24 is retaining means 38 which maintains the thermal device inserts in their respective predetermined locations. When a plurality of the thermal device inserts 16 are placed within flexible second fins 20, the thermal device inserts must be properly located over the chips 12. Subsequently, the location of thermal device inserts 16 must be maintained. In the present invention, this is not as much a problem as was previously the case since the flexible fins securely engage the rigid fins. Nevertheless, it is desirable to have means to prevent the thermal device inserts from shifting their respective positions during shipment of the module, for example. The arms of retaining means 38 act in such a manner to prevent the thermal device inserts from shifting. The retaining means 38 also resides in channels 40 of flexible second fins 20.

Biasing means 24 may be fabricated by a number of manufacturing methods. A method found advantageous by the present inventors is to take a thin sheet of stainless steel or other suitable material and then to etch the desired pattern. The remaining material may then be bent to form the necessary cantilever arms, retaining means, etc. While stainless steel is the preferred material, a zirconium-copper alloy may also be used for the biasing means. Of course, the biasing means may be manufactured by methods other than the one just described.

An accomplishment of the present invention is eliminating the gap between the interspersed fins of the thermal device insert and the cooling hat. It has been found that this gap is a significant contributing factor to the overall thermal resistance of the high conduction cooling module. Accordingly, the thermal resistance of the module can be decreased by substantially eliminating the gap. This remains the case even though the thermal resistance of the flexible fins is not as low as for rigid fins. The thickness of each of the rigid fins may be increased somewhat so that the thickness of each of the rigid fins is greater than the spacing between each of the adjacent rigid fins. The increased thickness of the rigid fins further helps to dissipate heat in the present invention.

A preferred embodiment of the flexible second fin 20 is illustrated in FIGS. 5 and 6. As shown therein, the flexible fins are generally U-shaped in cross-section with the base of the U attached to the cooling hat at 42. The longitudinal dimension of the flexible fins approximates that of the thermal device insert. When the first and second fins are interspersed, the first rigid fin 17 is inserted between the legs 44 of second flexible fin 20. Channels 26, 28 remain available for the placement of the biasing means 24, which would of course have been inserted prior to the interspersing of the first and second fins. For ease of assembly, the ends 30 of each of the legs 44 are bent outwardly. In FIG. 5, one of the flexible fins 20 is removed so that the cantilever arm 32 of biasing means 24 can be seen.

The height of the fins may be varied if desired, consistent with thermal design principles. The optimal fin height may be determined in the following manner. The total thermal resistance of the fin arrangement is the sum of the thermal resistance of the average gap between the fins and the thermal resistances (summed) of the first and second metal fins. The optimal thermal resistance is obtained when the thermal resistance of the average gap approximately equals the summed thermal resistances of the metal fins. For example, taller fins give a relatively smaller average gap thermal resistance (large area) but a larger summed metal thermal resistance. Conversely, shorter fins have a relatively larger average gap thermal resistance (smaller area) but a smaller summed metal thermal resistance. The optimal design will usually lie somewhere between these two extremes.

The present invention has thus far been described in general terms in that at least one of the first and second fins is flexible. More specifically, one of the first and second fins is flexible and the other is substantially rigid. In the preferred embodiment just discussed, the first fins (of the thermal device insert) are substantially rigid while the second fins (of the cooling hat) are flexible. Other embodiments of the invention will now be discussed.

Referring now to FIG. 7, there is shown an embodiment of the invention where both the first and second fins are flexible. As in FIG. 6, second flexible fin 20 is generally U-shaped. Now, however, first fin 17 is also generally U-shaped and is attached to the rigid base of the thermal device insert at 46.

It is also possible that at least one of the first and second fins could be tapered. Thus, in FIG. 8, first fin 17 is rigid and tapered. This embodiment ensures that the lines of contact between the flexible fins and the rigid fins are always below the tops of the fins which further ensures that the springs will not be forced open in case of misalignment between the flexible fins and the rigid fins. The same result can be achieved if the rigid fins are straight and the flexible fins are tapered. This latter embodiment of the invention is not shown in the Figures.

In FIG. 9, short flexible fins 20 contact short rigid fins 17 at the bends in the springs. In this case, the locations of the lines of contact are nearly independent of chip tilt. The spring force of the flexible fins may be made higher to ensure zero gap along the lines of contact. Because of the low thermal resistance through the contacts, long engagement length is not required.

In another embodiment of the invention, as shown in FIG. 10, the legs 44 of second flexible fins 20 are interspersed between each of the rigid first fins 17. Note that the ends 30 of the flexible fins are preferably turned inwardly to assist in the assembly of the first and second fins.

It may be desirable to make the second flexible fins out of a soft heat conductive material such as copper which has limited elasticity (i.e., low elastic limit). In this design, separate biasing means, for example springs 48, are inserted between the legs of the second flexible fins 20. This embodiment is illustrated in FIG. 11.

Figure 12:
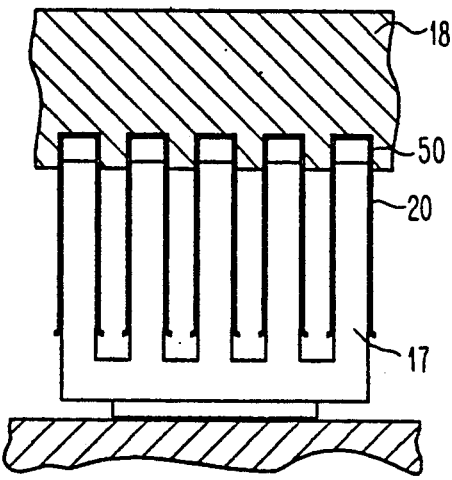

It is also contemplated within the scope of the invention that the second flexible fins 20 may be seated within grooves or slots 50 within the cooling hat 18. This embodiment, illustrated in FIG. 12, provides an additional heat flow path through the otherwise non-overlapped portions of the flexible fins.

Figure 13:
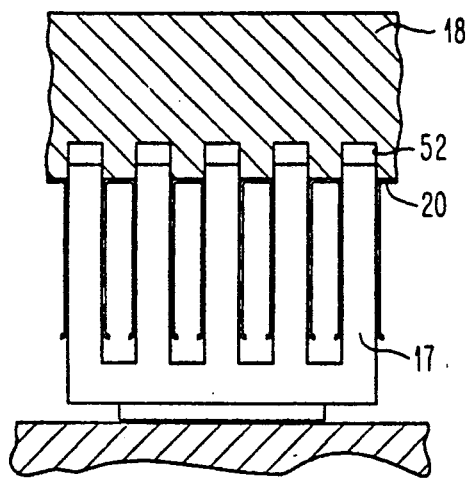

In FIG. 13, the cooling hat 18 further comprises grooves or slots 52 between each of the flexible fins 20. When the first fins 17 are interspersed with the flexible fins 20, the ends 31 of the first fins 17 are at least partially received in these grooves or slots 52. In this way, short flexible fins may be mated with longer first fins.

Generally speaking, however, it is preferred that the first and second fins be of equal dimensions.

In the previous embodiments, the first fin 17 has been rigid and the second fin 20 flexible or both fins 17, 20 were flexible. The previously described embodiments apply equally as well to those designs where the first fins 17 are flexible and the second fins 20 are rigid.

Figures 14A, 15A, 16A:
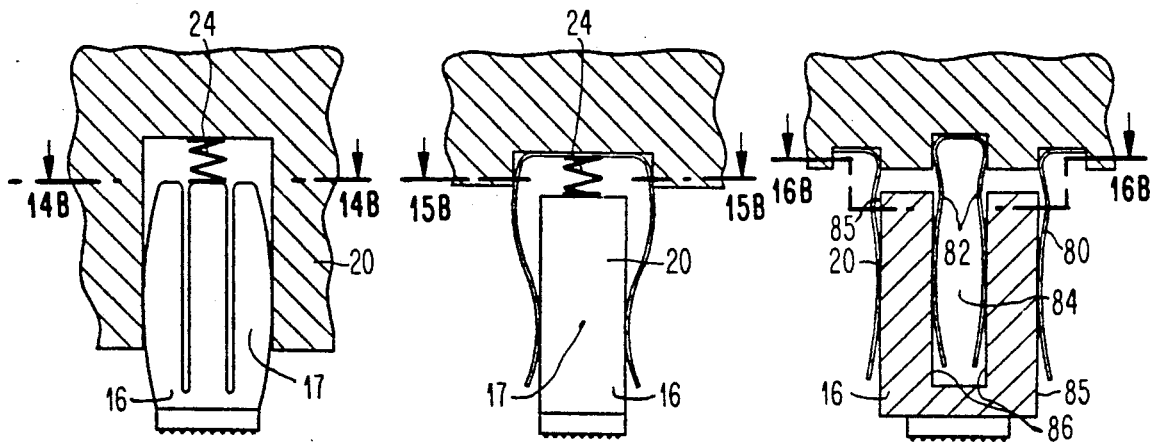
Figures 14B, 15B, 16B:
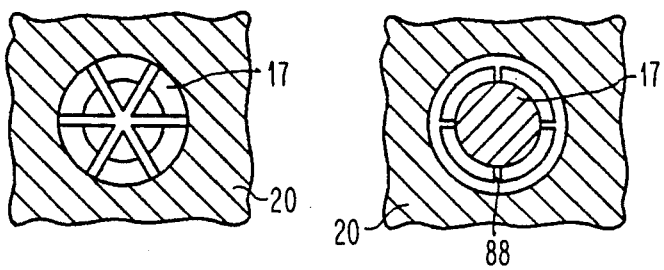

Referring now to FIGS. 14, an embodiment of the invention is shown wherein the thermal device insert 16 has a circular cross-section, as can be seen in FIG. 14B. In this embodiment, flexible fins 17 are inserted within rigid fins 20 and each thermal device insert 16 may have its own biasing means 24.

There may, in fact, be only one fin comprising the thermal device insert. As can be seen in FIG. 15A, thermal device insert 16 has a single rigid fin 17 which intermeshes with flexible fins 20. This thermal device insert 16 may be also circular in cross-section and have its own biasing means 24. As can be seen in FIG. 15B, flexible fins 20 are also circular and are preferably segmented, i.e., having gaps 88.

In FIG. 16A, rigid fins 17 mesh with flexible fins 20. In this embodiment, however, outer flexible fins 80 contact the outer surface 85 of rigid fins 17 while inner flexible fins 82 protrude into an inner cavity 84 of the thermal device insert 16 to contact an opposite surface 86 of rigid fins 17. As can be seen from FIG. 16B, the rigid fins 17 and flexible fins 20 are circular in cross-section. Additionally, flexible fins 20 preferably are segmented with gaps 90.

In the embodiments of FIGS. 17 to 19, the flexible fin is axially split. For purposes of illustration and not of limitation, the flexible fins in these embodiments are the first fins 17 and the second fins 20 are rigid. The relative positions of the first and second fins could just as easily have been reversed.

Referring now to FIG. 17, first fins 17 have been axially split 54 instead of being U-shaped in order to be flexible. Second fins 20 are rigid. In FIG. 18, the rigid fins are tapered.

In FIG. 19, the first flexible fins 17 are axially split but are also heavier in cross-section with decreased flexibility. It is preferred that the central portion 58 of the axially split fins have a large radius as shown. To increase the flexibility somewhat, the axially split fins are notched 60 at their base. The outer fins 56 of the second fins (which are rigid) may also be made heavier in cross-section.

FIG. 20 illustrates a final embodiment of the present invention. The thermal device insert has first flexible fins 17 which engage rigid second fins 20. The rigid second fins also have an enlarged tapered base portion 62 which engages the tips 64 of the flexible fins. In FIG. 20A, rigid fins 20 are about to enter flexible fins 17. Thereafter, the flexible fins 17 are spread apart beyond their elastic limit, as shown in FIG. 20B, and then withdrawn back to their operating location, as shown in FIG. 20C. This results in controlled spring force and location.

Other advantages of the invention will become more apparent after referring to the following examples.

EXAMPLES

In the following comparative examples, the high conduction cooling apparatus of Horvath et al. was compared to the high conduction flexible fin cooling apparatus of the present invention.

The dimensions of the critical components of the present invention are determined by the size and power dissipation of the chips to be cooled. That is, in order to dissipate heat from a 25 watt chip (in the case of the Horvath et al. apparatus) or a 35 watt chip (in the case of the present invention) of chip size 6.5×6.5 mm square in a system wherein poly(alphaolefin) oil is used as the compliant thermal medium and wherein the finned internal thermal device insert is made of copper, the preferred embodiment may be constructed in the following manner.

The preferred insert of the present invention has 6 rigid fins and each fin has a width of 1 mm. The width of the flexible fins of the cooling hat are approximately 0.15 mm. For the Horvath et al. apparatus, there are 5 rigid fins and each fin has a width of 0.8 mm. The fins of the cooling hat are also rigid and have a width of 0.8 mm.

For each apparatus, the rigid base of the insert is about 9.1 mm square and about 1.3 mm thick. The vertical height of each fin from the top of the rigid base is approximately 5.8 mm. The length of the fins in the has is about 5.8 mm. The overlapping length of corresponding fins is about 4.8 mm.

The average width of the oil filled gap between corresponding fins is approximately, 0.035 mm for the Horvath et al. apparatus and approximately 0.009 mm for the present invention.

A double cantilever spring was used for each apparatus; however, the spring for the Horvath et al. apparatus was made from a zirconium/copper alloy while the spring for the present invention was made from stainless steel. To accommodate manufacturing tolerances, there was about a 0.8 mm space between the top of the fins and the hat and a 0.8 mm space between the bottom of the fins and the rigid base of the insert.

For the above described Horvath et al. apparatus, the total thermal resistance was approximately 1.1° to 1.4° C. per watt. This thermal resistance measured between the chip and the cooling hat provided for the required dissipation of approximately 25 watts per 6.5 mm square chip in a high conduction cooling system wherein the water or other thermally conductive fluid cannot be directly incorporated into the chip compartment.

In comparison, the total thermal resistance for the present invention was about 0.8° C. per watt which was sufficient to dissipate approximately 35 watts per 6.5 mm square chip in a similar high conduction cooling system.

In either apparatus, chip tilt and height variations are easily accommodated. The double cantilever spring retained the finned internal thermal device insert against the chip surface with at least 120 grams of force, but less than approximately 500 grams of force to prevent damage to the solder ball joints or chips circuitry. In addition, the temperature over the surface of the chip was uniform and maintained within acceptable limits. No debris was found at the interface, as all was embedded into the soft metal face of the finned internal thermal device insert.

The results are summarized in Table I below.

TABLE I

|  | Present Invention mm. | Horvath et al mm. |
| --- | --- | --- |
| Oil gap | .009 | .036 |
| Cooling hat fin thickness | .15 | .8 |
| Insert slot width | .51 | .89 |
| Insert fin width | 1 | .8 |
| Number of fins | 6 | 5 |
| Overlap (engagement length) | 4.8 | 4.8 |
| Tilt accommodation | Flexing Fins | Fin gaps |
| Thermal resistance of Gap (Rgap) | .14° C./w | .56° C./w |
| Thermal Resistance | .8° C./w | 1.1–1.4° C./w |

TABLE I-continued

|  | Present Invention mm. | Horvath et al mm. |
| --- | --- | --- |
| Chip & Cold Plate (Rint) |  |  |
| Pchip (max) | 35 watts | 25 watts |

It is believed that with a larger 10 mm square chip, these results can be improved to Rint=0.5° C./watt and Pchip(max)=60 watts with the present invention.

It will be apparent to those skilled in the art that having regard to this disclosure that other modifications of this invention beyond those embodiments specifically described here may be made without departing from the spirit of the invention. Accordingly, such modifications are considered within the scope of the invention as limited solely by the appended claims.

We claim:

1. An apparatus for removing heat from a heat generating device comprising:
   at least one heat conductive thermal device insert comprising a base having at least one first fin on a first surface and a second surface which is flat;
   a second heat conductive thermal device having a plurality of second fins;
   said at least one first fin being interspersed and overlapped with said second fins;
   wherein at least one of said first and second fins is of a thermally conductive, flexible material so that a gap otherwise existing between said overlapped and interspersed fins is eliminated over at least a portion of said overlap and wherein at least a portion of said first and second fins are biased against one another.

2. The apparatus of claim 1 wherein there are a plurality of said first fins and wherein there are a plurality of flexible fins.

3. The apparatus of claim 2 wherein said second fins are flexible fins.

4. The apparatus of claim 2 wherein said flexible fins are generally U-shaped with the base attached to the second thermal device.

5. The apparatus of claim 4 wherein the legs of each of said flexible fins are interspersed between each of the first fins.

6. The apparatus of claim 5 further comprising a biasing means between the legs of each of said flexible fins.

7. The apparatus of claim 4 wherein each of said U-shaped flexible fins receives a mating fin from said first fins.

8. The apparatus of claim 5 further comprising grooves or slots in said second thermal device between each of said flexible fins and the first fins being received in said grooves or slots.

9. The apparatus of claim 4 wherein said flexible fins are seated in grooves or slots in said second thermal device.

10. The apparatus of claim 3 wherein said first fins are substantially rigid.

11. The apparatus of claim 2 wherein said first fins are the flexible fins.

12. The apparatus of claim 2 wherein said flexible fins are generally U-shaped with the base attached to the first surface of said thermal device insert.

13. The apparatus of claim 12 wherein the legs of each of said flexible fins are interspersed between each of the second fins.

14. The apparatus of claim 13 further comprising a biasing means between the legs of each of said flexible fins.

15. The apparatus of claim 12 wherein each of said U-shaped flexible fins receives a mating fin from said second fins.

16. The apparatus of claim 13 further comprising grooves or slots in said thermal device insert between each of said flexible fins and the second fins being received in said grooves or slots.

17. The apparatus of claim 12 wherein said flexible fins are seated in grooves or slots in said thermal device insert.

18. The apparatus of claim 11 wherein said second fins are substantially rigid.

19. The apparatus of claim 2 wherein both of said first and second fins are flexible.

20. The apparatus of claim 19 further comprising a biasing means between the legs of each of said flexible fins.

21. The apparatus of claim 19 wherein said first flexible fins are seated in grooves or slots in said thermal device insert.

22. The apparatus of claim 19 wherein said second flexible fins are seated in grooves or slots in said second thermal device.

23. The apparatus of claim 1 wherein said second thermal device is a cooling hat.

24. The apparatus of claim 2 wherein one of said fins is flexible and the other of said first and second fins is substantially rigid.

25. The apparatus of claim 24 wherein one of said fins is tapered.

26. The apparatus of claim 24 wherein said flexible fins are axially split.

27. The apparatus of claim 26 wherein said axially split fins are notched at the bottom of the split.

28. The apparatus of claim 24 wherein each of said rigid fins has an enlarged, tapered base portion which engages each of said flexible fins.

29. The apparatus of claim 2 further comprising a biasing means located between the fins of said thermal device insert or said second thermal device, said biasing means exerting a biasing force between said thermal device insert and said second thermal device.

30. The apparatus of claim 29 wherein there are a plurality of said thermal device insert.

31. The apparatus of claim 30 wherein said biasing means is located between the fins in said second thermal device.

32. The apparatus of claim 31 wherein said biasing means further comprises means for maintaining said thermal device inserts in their respective predetermined locations.

33. The apparatus of claim 1 wherein said apparatus further comprises a compliant thermally conductive medium.

34. The apparatus of claim 33 wherein said compliant thermally conductive medium is poly(alphaolefin) oil.

35. The apparatus of claim 24 wherein the thickness of each of said rigid fins is greater than the spacing between each of said rigid fins.

* * * * *